United States Patent [19]

Michaelson

[11] Patent Number: 4,581,301

[45] Date of Patent: Apr. 8, 1986

[54] ADDITIVE ADHESIVE BASED PROCESS FOR THE MANUFACTURE OF PRINTED CIRCUIT BOARDS

[76] Inventor: Henry W. Michaelson, 744 Birchwood Ct., Westbury, N.Y. 11590

[21] Appl. No.: 598,924

[22] Filed: Apr. 10, 1984

[51] Int. Cl.[4] .............................................. B22F 3/00
[52] U.S. Cl. .................................. 428/551; 428/547; 428/901; 156/901; 427/97
[58] Field of Search ...................... 29/825, 829–831, 29/846, 848; 156/901; 428/901, 548–560, 545, 546, 547; 427/96, 97

[56] References Cited

U.S. PATENT DOCUMENTS

| Re. 28,042 | 6/1974 | Rhodenizer et al. | 117/212 |
|---|---|---|---|
| 3,031,344 | 4/1962 | Sher et al. | 428/551 |
| 3,576,662 | 4/1971 | Diebold et al. | 428/551 |
| 3,594,229 | 7/1971 | Kefalas | 428/560 |
| 3,620,933 | 11/1971 | Grunwald | 204/15 |
| 3,625,758 | 12/1971 | Stahl et al. | 117/212 |
| 3,666,549 | 5/1972 | Rhodenizer et al. | 117/212 |
| 3,764,280 | 10/1973 | Lupinski | 428/551 |
| 4,217,182 | 8/1980 | Cross | 204/15 |
| 4,248,921 | 2/1981 | Steigerwald et al. | 428/551 |
| 4,253,875 | 3/1981 | Heymann et al. | 106/1.26 |
| 4,404,237 | 9/1983 | Eichelberger et al. | 427/96 |
| 4,470,883 | 9/1984 | Eichelberger et al. | 204/15 |
| 4,528,748 | 7/1985 | Eichelberger et al. | 29/835 |

FOREIGN PATENT DOCUMENTS 2448738 4/1976 Fed. Rep. of Germany ...... 428/548

OTHER PUBLICATIONS

"The Use of Catalytic Basis Materials and Ductile Electroless Deposition in the Manufacture of Wiring", Plating, Alder et al., vol. 56, No. 8, 8–69.
"Enhancing Copper Adhesion" IBM Tech Disclosure Bulletin, Ameen et al., vol. 16, No. 10, 3–1974 p. 3179.
"Copper Oxide Undercut . . . on Multilayer Boards", Proceedings Fourth Annual Printed Circuits Conference, Betteridge et al., 1981, pp. 1–10.
"Additive Plating Coverage", IBM Tech Disclosure Bulletin, Canestaro, vol. 20, No. 9, 2–1978, p. 3391.
"Production of Printed Circuits . . . " Transactions of the Institute of Metal Finishing, Lonhoff, vol. 46, Spring 1968, Part 1, pp. 194–198.

Primary Examiner—John F. Terapane
Assistant Examiner—T. J. Wallen
Attorney, Agent, or Firm—Peter L. Michaelson

[57] ABSTRACT

An additive process, for manufacturing multiple- (single or double) sided printed circuit boards, which advantageously provides substantial adhesion, very fine resolution and significant manufacturing time and cost savings over prior art processes, is disclosed. Specifically, a seed layer, comprised of conductive particles, such as carbon, dispersed throughout a binder capable of adhering to an unclad insulating printed circuit board substrate, is first applied over pre-defined locations on each surface of the substrate above which corresponding portions of a conductive pattern are to appear. This seed layer is also applied to coat substantially all the surface area of the walls of one or more holes formed through the substrate which are, in turn, to become plated-through holes. Thereafter, a conductive layer, such as copper, is electrolytically plated onto the seed layer in order to produce the conductive pattern and the plated-through holes.

20 Claims, 5 Drawing Figures

ADDITIVE ADHESIVE BASED PROCESS FOR THE MANUFACTURE OF PRINTED CIRCUIT BOARDS

BACKGROUND OF THE INVENTION

1. Field of the Invention

This invention is directed to both an additive process for manufacturing printed circuit boards and the printed circuit board produced thereby.

2. Description of the Prior Art

Over the past few decades, printed circuit boards have become the predominant, if not substantially exclusive, vehicle for mounting and interconnecting electronic components, e.g. resistors, capacitors, integrated circuits and the like, in order to manufacture any desired electronic circuit.

Basically, a printed circuit board consists of a sheet of rigid insulating substrate such as phenolic, glass impregnated epoxy or the like, having a pre-defined pattern of thin metallic—usually copper—foil cunductive paths (so-called "traces") appearing on one or both sides of the substrate. These traces collectively define all the electrical interconnections among all the components and are routed between appropriate locations on the board.

Generally, each component is electrically connected to its associated trace(s) through one or more corresponding mounting holes drilled completely through the substrate. Specifically, the leads of each component are first inserted into corresponding mounting holes and then, in turn, soldered to the associated trace(s). To ensure that a reliable electrical connection is made between each lead and its associated trace, the trace takes on a substantially circular appearance to form a so-called "pad" with the corresponding mounting hole at its center. Solder is then applied to cover the entire pad as well as the lead protruding through the mounting hole.

In some instances electrical components are situated on one side of the printed circuit board and the traces appear on the other. These boards, commonly referred to as a "single-sided" boards, are used primarily to implement relatively simple circuitry. Alternately, printed circuit boards may be fabricated with traces appearing on both sides. These boards are commonly referred to as "double-sided" boards and are finding substantially increasing use in fabricating relatively complex and/or dense circuits. In a double-sided board, the arrangement of traces appearing on either side is aligned with those appearing on the other side such that appropriate interconnections therebetween can be readily made through various suitable holes commonly referred to as "plated-through holes." In particular, the wall of each such hole is plated with a conductive material, usually copper, which electrically interconnects the pads appearing on both sides of the hole as well as providing an increased contact area between these pads and any corresponding component lead inserted through the plated-through hole.

Printed circuit boards can be manufactured using one or a combination of two well-known basic approaches; namely, the "subtractive" process and the "additive" process. As discussed in greater detail below, each process possesses unique drawbacks. In particular, the subtractive process is relatively expensive in that it requires the use of expensive photochemicals, resists and etchants and wastes substantial amounts of copper. In addition, the width of a trace is limited by a phenomena, described in detail below and commonly referred to as "undercutting," which limits the number of traces that can exist in any given area on a board; thereby disadvantageously restricting the overall circuit density that can exist on the board. While the additive process does not suffer from these deficiencies, this process, by contrast, generally produces very poor adhesion between the conductive foil comprising each trace and the insulating substrate. In fact, this adhesion is generally so low that very little force is required to lift any trace up off the board. Moreover a substantial amount of time, typically on the order of at least 28–40 hours, is disadvantageously required to manufacture a printed circuit board using the additive process.

Specifically, the subtractive process generally involves starting with a insulating substrate which has a relatively thick layer of copper laminated (clad) to one or both of its sides. Component mounting holes are then completely drilled through both the copper layer(s) and the substrate. Thereafter, a etch-resistant material (so-called "resist") typically in ink form, is applied usually by silk-screening or a similar technique, over each copper layer in a positive image of the desired circuit configuration to be fabricated thereon. Alternatively, to yield greater circuit density through increased resolution, i.e. narrow trace width, and uniform reduced spacing between adjacent traces, printed circuit board manufacturers are increasingly using photographic techniques. Here, a photo-sensitive resist (so-called "photoresist") is uniformly disposed over each entire copper layer. An appropriate photographic transparency is then made in the form of a negative of the desired circuit configuration for each side of the board. Each side of the board is then exposed through its corresponding transparency to intense utra-violet light. Those regions of the photo-resist which were exposed to this light polymerize and become etch-resistant. Thus, a positive latent image of the desired circuitry is formed in the photo-resist after exposure. Once the desired circuit pattern is formed in the resist, regardless of the specific technique used, the board is then immersed in a copper etchant bath which removes (etchs away) all the copper which is not protected by the resist or polymerized photo-resist. Once the etching is complete, the board is removed from the bath and the remaining resist is removed leaving the laminated copper on each side in the form of the desired circuit configuration thereon.

The subtractive method disadvantageously possesses several drawbacks. Chief among them is undercutting, i.e. lateral undermining of the traces found on the board and situated under the resist. Since the laminated copper layer is relatively thick, a strong etchant and considerable time is usually required to completely remove the excess copper during etching. Consequently, once enough of this copper is etched away, the lateral edges of the copper situated under the resist become exposed and thereafter this latter copper, supposedly protected by the resist, will be laterally etched away as long as the board remains in the etchant bath. Thus, whenever all the excess copper has been completely etched away, a significant amount of copper from the desired traces will also have been removed. As a result, the cross-sectional area and the current carrying capacity of each trace will be disadvantageouly reduced. To compensate for any expected undercutting, printed circuit board designers must use wider traces, than would otherwise be required in the absence of undercutting, in order to achieve any desired current carrying capacity. Unfortunately, the increased size (width and cross-sectional area) greatly limits the resolution, i.e. minimum width, of a trace. This thus disadvantageously impedes continued miniaturization of the traces and that, in turn, limits the density of the circuitry that can be fabricated using printed circuit boards. Unfortunately, whenever the thickness of the copper clad must be substantial, e.g. to carry relatively high currents, the etchant time must be increased which disadvantageously increases the likelihood of undercutting, and, in the absence of employing significantly wider traces, the likelihood that a desired conductive trace can be completely removed by undercutting; thereby further restricting circuit miniaturization. The problem of undercutting has been repeatedly recognized in the art. See, for example, U.S. Pat. No. Re. 28,042 (issued to H. L. Rhodenizer et al on June 11, 1974); U.S. Pat. No. 3,620,933 (issued to J. J. Grunwald on Nov. 16, 1971); and B. L. Betteridge et al, "Copper Oxide Undercut (Haloing) During Wet Processing on Multilayer Circuit Boards," *Proceeding PC'81—Fourth International Printed Circuits Conference*, New York, June 2-4, 1981, pp. 1-10.

The subtractive method possesses other drawbacks as well. For example, since the desired circuit configuration often occupies half of or, in most instances, much less than half of the total available area of each laminated copper layer, considerable copper is wasted during etching. While copper-rich etchant solutions can be processed to recover this copper, the associated expense is generally considerable and usually economically unprofitable unless an exceedingly large number of printed circuit boards are being manufactured. Since most manufacturers do not produce this many boards, copper-rich etchant is often discarded and a significant amount of copper is lost. Moreover, resists and particularly photo-resists tend to be quite expensive.

In an effort to eliminate wasted copper, the art has developed an alternate process, i.e. the so-called additive process, for manufacturing printed circuit boards. With this method, the only copper that is consumed is that needed to produce the desired traces on each printed circuit board. Specifically, the additive process starts merely with the unclad insulating substrate used for the printed circuit board. All the holes, which are to become plated-through holes are then drilled through the substrate. Thereafter, an activating agent which promotes the adhesion of copper to the unclad insulating substrate is generally applied over the entire substrate. A mask is then applied to the substrate, and the substrate is then, in turn, immersed in an electroless copper plating bath which deposits copper onto all the non-masked areas including the walls of the holes. Once the plating is completed, the board is removed from the bath and a protective coating (e.g. a solder mask) is applied over each plated side of the board.

Clearly, the additive process saves copper. Inasmuch as this process generally minimizes or totally eliminates the need for etchants, undercutting simply does not occur in the additive process. Thus, narrow traces can be made using this process which, in turn, advantageously permit denser circuits to be manufactured than those obtainable through the subtractive process. However, the additive process unfortunately possesses several significant drawbacks—substantial time, on the order of 28-40 hours, is disadvantageously required to electrolessly deposit a copper coating of sufficient thickness and, more significantly, once this coating is completely deposited, it adheres extremely poorly to the substrate. This poor adhesion causes the printed circuit, i.e. the plated copper traces, to easily "peel" off the substrate during subsequent manufacture and/or use of the board. Several attempts have been disclosed in the art for promoting adhesion between the copper and the subtrate; however, these attempts either result in only a marginal improvement in adhesion or are either too expensive or complex to implement in practice. See, for example, the processes disclosed in U.S. Pat. No. 4,253,875 (issued to K. Heymann et al on Mar. 3, 1981); U.S. Pat. No. 4,217,182 (issued to J. E. Cross on Aug. 12, 1980); U.S. Pat. No. 3,666,549 (issued to H. L. Rhodenizer et al on May 30, 1972) and reissued as U.S. Pat. No. Re. 28,042; U.S. Pat. No. 3,625,758 (issued to F. T. Stahl et al on Dec 7, 1971); and also M. J. Canestaro, "Additive Plating Coverage," *IBM Technical Disclosure Bulletin*, Vol. 20, No. 9, Feb. 1978, page 3391; A. Adler et al, "The Use of Catalytic Basis Materials and Ductile Electroless Copper Deposition in the Manufacture of Printed Wiring," *Plating*, Vol. 56, No. 8, Aug. 1969, Pages 880, 882, 884, 886 and 888; and N. Lonhoff, "Production of Printed Circuits by the Additive Techniques using Nibodur," *Transactions of the Institute of Metal Finishing*, Vol. 46, Spring 1968, Part I, Pages 194-198.

Thus, while the additive process offers substantial cost savings—through eliminating copper waste and minimizing the use of etchants—over the subtractive process as well as providing increased miniaturization capability, no truly effective, inexpensive and simple solution has yet been found in the art to the problem occurring in the additive process of providing substantial adhesion between a copper coating and a printed circuit board substrate. Inasmuch as the subtractive process usually provides adequate adhesion, manufacturers have to date primarily relied on this process to manufacture printed circuit boards even in spite of its drawbacks: high cost and restricted potential for increased miniaturization.

SUMMARY OF THE INVENTION

Accordingly, an object of the present invention is to provide a process for manufacturing printed circuit boards which provides substantial adhesion between the substrate and the conductive pattern appearing thereon.

Another object is to provide such a process which is capable of yielding extremely dense circuits by producing individual traces having a very fine resolution.

A specific object is to provide such a process which completely eliminates undercutting.

A further object is to provide such a process which eliminates the use of photo-chemicals, etchants and resists.

An additional object is to provide such a process which can be easily used on both single- and double-sided boards.

Lastly, a further object is to provide such a process which is extremely simple, quick and highly economical to use in a manufacturing environment.

These and other objects are accomplished in accordance with the present invention by first applying a seed layer over pre-determined locations on a surface of a substrate wherein the seed layer is comprised of conductive particles dispersed thoughout a binder capable of adhering to the substrate, and thereafter electrolytically plating a conductive layer onto the seed layer so as to form a desired conductive pattern.

Specifically, a printed circuit board is manufactured in accordance with the preferred embodiment described herein by first drilling substantially all the necessary and feed-through holes through an appropriately sized sheet of printed circuit board substrate material. Thereafter, a seed layer is selectively applied to one of the sheet by silk-screening or similar techniques, such that the layout of the seed layer exactly resembles a desired conductive pattern, i.e. the pattern of traces and/or pads that comprise one side of the printed circuit board. This process is then repeated, although usually using a different layout, for the opposite side of the substrate.

The binder used in the seed layer is preferably a liquid epoxy suitable for silkscreening. The viscosity of the liquid is chosen to be sufficiently low so that, during silkscreening of each side, the seed layer will penetrate each hole to at least half its depth and adhere to its wall.

Once the binder has cured, the "seeded" board is then immersed in an electrolytic plating bath and metal, generally copper, is plated onto one surface of the board at a time. To facilitate plating, an electrode is placed in intimate physical contact all along one entire side (the "electrode" side) of the board and metal is electrolytically plated onto the other side (the "active" side). Plating continues until a layer of metal reaches a sufficient thickness on the active side. At that point, the board is removed from the bath and then detached from the electrode. In the case of a double-sided board, the electrode is then attached to what was previously the active side and the board is re-immersed into the plating bath. Plating begins again. Once the board has been completely plated--on one side for a single-sided board or on both for a double-sided board, the board is washed to remove any vestiges of the plating solution; thereafter, components can be mounted onto the board.

Inasmuch as metal is only plated onto those locations on the active side where current flows between the seed layer and the plating solution, a current carrying path must be established from the electrode side of the board to the active side. Such a path is advantageously provided through the conductive seed layer that coats the cylindrical wall of each hole. Hence, one end of the seed layer coating each hole directly contacts the electrode and thus current is directly routed from the electrode, via each hole, to the conductive seed layer on the active side. The multiplicity of holes provides a corresponding multiplicity of current sources to the active side, which, in turn, ensures that a substantially uniform plating current always flows throughout the seed layer on the active side. This thereby advantageously produces a highly uniform metallic deposition all along this side.

In accordance with a feature of the present invention, the particular material chosen for the conductive particles is not critical. Although carbon is preferred because it is both chemically stable under heat and extremely inexpensive, a variety of other materials which either do not oxidize in the presence of relatively low heat or form conductive oxides can be used instead.

Another feature of the invention is that the material chosen as the binder is also not critical as long as it permits a relatively uniform dispersion of metallic particles to exist within it, it can be applied by silkscreening or similar techniques and it strongly adheres to the substrate material.

BRIEF DESCRIPTION OF THE DRAWING

The invention may be clearly understood by considering the following detailed description in conjunction with the accompanying drawing in which.

To facilitate understanding, identical reference numerals are used to denote identical elements common to the figures.

DETAILED DESCRIPTION

While the principles of the present inventive process are equally applicable to the fabrication of either single-(one) sided or double-(two) sided printed circuit boards, this process, to facilitate understanding by the reader, will be initially described as it pertains to the fabrication of a double-sided printed circuit board.

Figure 1:
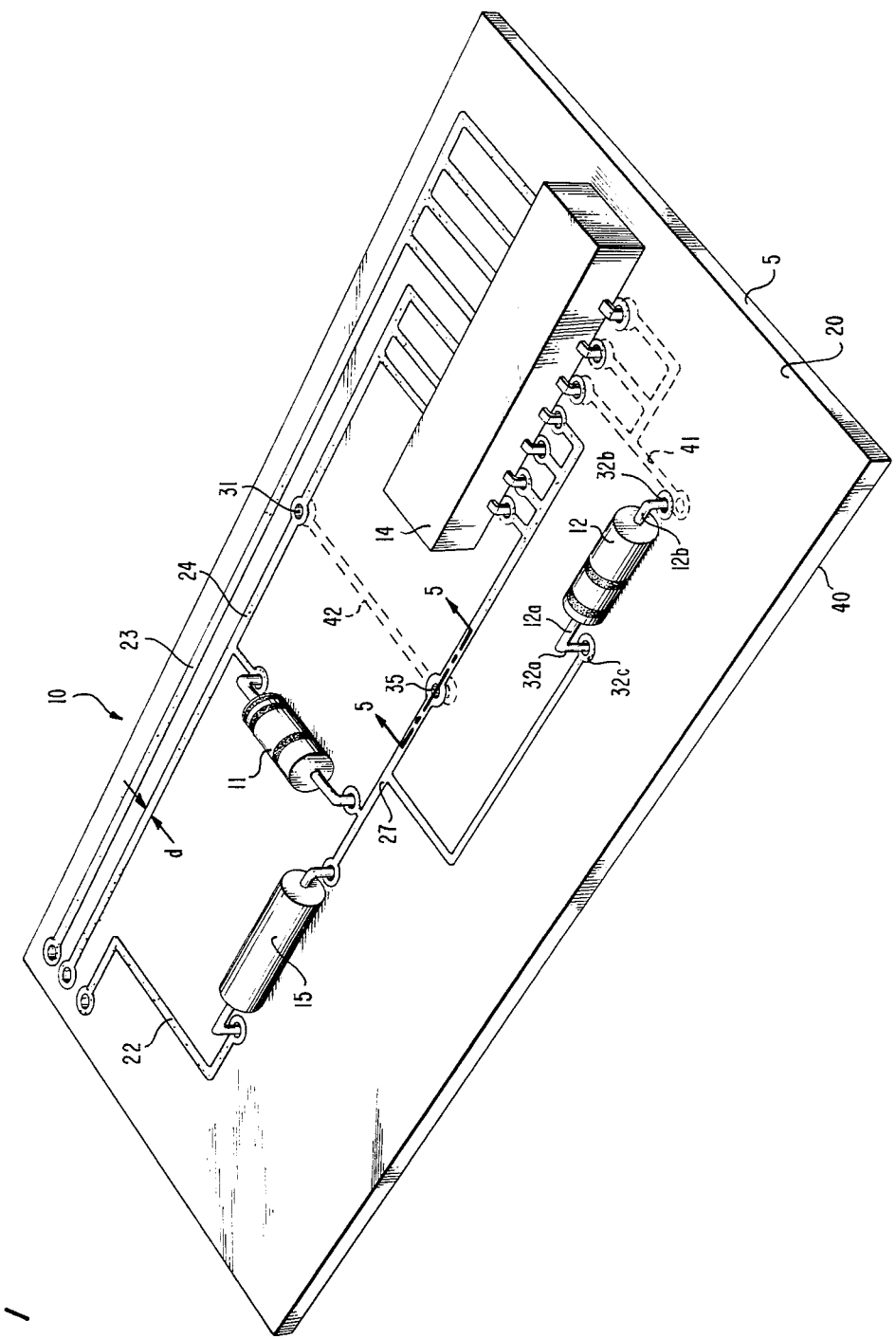
FIG. 1 is a top perspective view of printed circuit board 10 fabricated in accordance with the teachings of the present invention.

FIG. 1 shows a top perspective view of a double-sided printed circuit board 10 (hereinafter referred to as board 10) which is highly simplified and enlarged for illustrative purposes and which has been fabricated in accordance with the teachings of the present invention. Like all other printed circuit boards, board 10 has a number of electronic components, such as resistors 11 and 12, capacitor 15 and integrated circuit 14, mounted on it. These components are all electrically interconnected through various traces, such as traces 22, 23, 24, and 27 situated on the upper surface, i.e. surface 20, and traces 41 and 42 shown by dotted lines and situated on the lower surface, i.e. surface 40, both of board 10. These traces are generally copper. Each component, such as resistor 12, makes electrical contact with the board whenever its associated leads, such as leads 12a and 12b, are inserted into and then soldered to appropriately situated plated-through mounting holes, such as holes 32a and 32b, respectively, drilled through unclad insulating substrate 5 of board 10. Each plated-through hole, such as hole 32a, makes electrical contact with its associated traces, such as trace 27, by means of a small annular shaped conductive region, commonly referred to as a "pad," such as pad 32c, which is formed around each side of the hole. Each pad is typically fabricated from the same electrically conductive plating material that lines the wall of each plated through hole, and electrical contact is made between each pad and its associated trace by merely extending the trace into the pad. Since traces are located on both surfaces of the board, occasionally the need arises to inter-connect a particular trace on one side with a corresponding trace on the other side. These inter-connections are readily accomplished by a so-called "feed-through" which is merely a single plated-through hole appropriately situated between the particular trace on one side and a corresponding trace on the other. These feed-throughs are typified by feed-throughs 31 and 35 which are used to interconnect traces 24 and 42, and 42 and 27, respectively. Plated-through mounting holes also usually serve as feed-throughs; although, for purposes of simplicity, none of the plated-through mounting holes shown in FIG. 1 provide this function.

With the above in mind, the remaining discussion will center on the manner in which board 10 is fabricated.

The prior art teaches that printed circuit boards can generally be manufactured using one or a combination of two well-known basic approaches; the subtractive process and the additive process. Unfortunately, each process possesses unique drawbacks which limit its applicability. In particular, the subtractive process, which relies on removing excess copper from a double-sided copper clad substrate, not only requires expensive photochemicals and etchants and wastes significant amounts of copper; but more importantly, this process artificially limits the minimum width (resolution) of a trace (dimension "d" shown in FIG. 1) through a phenomena known as "undercutting." This phenomena, in turn, effectively restricts the number of separate traces that can exist in any give area on the board and thus disadvantageously limits the overall circuit density that can exist on the board. By contrast, the additive process, which relies on electrolessly depositing traces on an insulating substrate, disadvantageously consumes an excessive amount of time and generally produces extremely poor adhesion between each trace and the substrate. In view of these deficiencies printed circuit board manufactures have opted to forsake maximum density in view of obtaining adequate trace/substrate adhesion and have thus chosen to use the subtractive process.

All these deficiencies in the prior art processes have been advantageously eliminated or minimized in accordance with the teachings of the present inventive process. Specifically, the inventive process comprises first applying a seed layer over pre-determined locations on a surface of a substrate wherein the seed layer is comprised of metallic particles dispersed throughout a binder capable of adhering to the substrate, and second electrolytically plating a conductive layer, illustratively copper, onto the seed layer so as to form any desired pattern of traces, pads and plated-through holes on the board.

Figure 2:
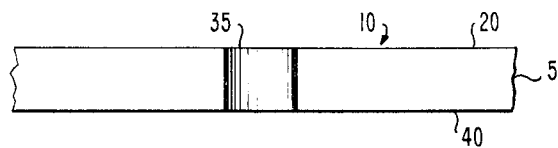
FIGS. 2 and 3 are cross-sectional views of board 10, particularly hole 35, taken at different stages in the manufacture of the board.
Figure 3:
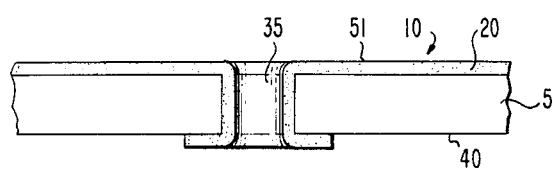
Figure 5:
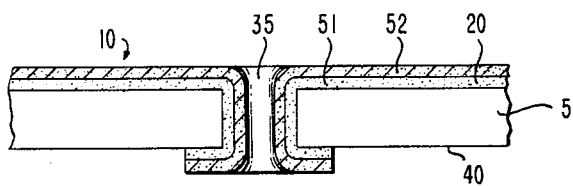
FIG. 5 is a cross-sectional view of board 10, taken along lines 5—5 shown in FIG. 1, after the board has been completely manufactured according to the teachings of the present invention.

FIGS. 2, 3 and 5 depict cross-sectional views of board 10, particularly in the vicinity of feed-through 35, occurring at various stages in the fabrication of the board according to the inventive process.

To manufacture board 10, insulating substrate 5 is first cleaned using one or more well known solvents and thereafter all the necessary holes, including those needed to accommodate component leads and feed-throughs, are drilled through the substrate. In the vicinity of each hole, the resulting board, in cross-section, generally resembles that shown in FIG. 2. Hole 35, as shown in FIG. 1, is used to provide a feed-through.

After all the necessary holes have been drilled, a conductive seed layer is applied to each surface of the board. Generally this seed layer is in the form of a liquid (e.g. such as an ink) and is comprised of conductive particles, preferably carbon, uniformly dispersed throughout a liquid binder, which exhibits substantial adhesion to the substrate. Particle size is not critical inasmuch as any size finer than that which can pass through a 400 size mesh will produce satisfactory results. While both the exact conductivity and thickness of the seed layer are also not critical, sufficient particles should be distributed throughout the seed layer such that its conductivity is 1 Kohm/cm$^3$ or less and a thickness of 0.004–0.008 mils (1–2 $\mu$m (microns)) is preferred inasmuch as it provides excellent results. The seed layer is only applied to those regions on each surface directly above which a trace or pad is to appear. Well known techniques, such as silkscreening or the like, can be used to selectively apply the seed layer only to the desired areas of each surface while effectively masking off the remainder of the board. In addition, the seed layer is permitted to penetrate each hole that is to be plated-through. The viscosity of the binder is chosen such that the seed layer will coat nearly, if not completely, all the surface area of the wall of each such hole to a level of more that half and preferably two-thirds of the total depth of the hole. Since the seed layer is silkscreened onto both surfaces, the entire wall of each such hole will be coated with the seed layer. A cross-section of board 10, taken through feed-through 35 after seed layer 51 has been applied to the substrate, is shown in FIG. 3.

Once the seed layer has been applied to both surfaces of the board, the board is then baked at an appropriate temperature and for a sufficient interval of time to thermally cure the adhesive binder. If, for example, a thermoset epoxy is used for the binder, then it may require exposure to 150° C. heat for a period of approximately 30 minutes to adequately cure the epoxy. Clearly, other adhesives will require different temperatures and times to effectuate an adequate cure.

Figure 4:
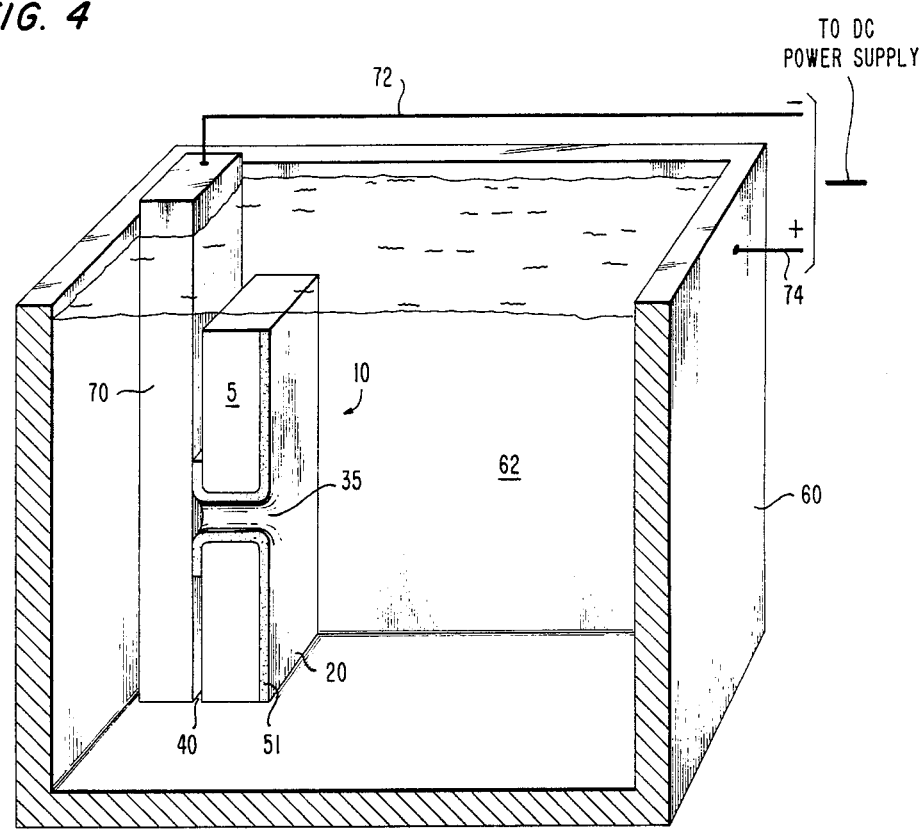
FIG. 4 is a simplified diagram of the apparatus used to electrolytically plate board 10 during its manufacture.

Once the seed layer is applied to both surfaces of the board and then appropriately cured, a conductive layer, usually (but not limited to) copper, is then electrolytically plated, as shown in FIG. 4, onto each surface of the board—of which only hole 35 and a surrounding section of board 10 are shown for clarity and are both substantially enlarged merely for purposes of illustration. Specifically, the board is attached to a suitable electrode 70 such that this electrode makes a tight abutting electrical contact with substantially the entire conductive seed layer comprising most, if not all, of the pads occurring on one surface, such as surface 40 of board 10. Thereafter, one end of the electrode and the entire attached board are immersed in a suitable electroplating solution 62 contained within electroplating tank 60. Thereafter, a suitable relatively low direct current (d.c.) voltage is applied between leads 72 and 74 to cause an electrical current to flow within the solution towards electrode 70. This, in turn, causes free electrons to exist on the seed layer which precipitates positively charged copper ions out of solution and thus deposits copper all along the seed layer on surface 20 as well as on the walls of all the "seeded" holes, such as hole 35. After the plating current has been allowed to flow for a pre-determined time interval sufficient to deposit a layer of copper to a desired thickness on surface 20, the d.c. power is shut off. The electrode is then removed from the plating solution and the board is reversed in order to expose its opposite surface, i.e., surface 40, to the solution and is then re-attached to the electrode. The electrode is then re-immersed into the plating bath and the current is then re-applied in order to electrolytically plate newly exposed surface 40.

Hence, it is readily apparent that the conductive seed layer serves two advantageous purposes: first, the binder firmly adheres to the substrate, and second, the seed layer provides a conductive path from one side of the board to the other thereby eliminating the need for complex electrodes while ensuring that a copper layer is uniformly plated over the seed layer on each surface of the board as well as on the walls of those holes that are to become plated-through. Once both sides of the board have been sufficiently plated, the board is withdrawn from the plating bath. It may then be necessary to clean and/or rinse the entire board, as appropriate, using one or more well-known solvents in order to remove any residual traces of the plating solution from the entire board. Thereafter, a solder mask may be applied to each surface of the board using well-known techniques, and components may then be installed on and soldered to the board. A cross-sectional view of the finished board, taken through feed-through 35 and along lines 5—5 of FIG. 1, is shown in FIG. 5. The seed layer is labelled 51 and the conductive electrolytically plated copper layer is labelled 52.

While any liquid adhesive, such as illustratively an acrylic-, polymer- or epoxy-based adhesive, that exhibits substantial adhesion to the unclad insulating substrate can be chosen for the binder, preferably a thermal setting epoxy is used. Such an epoxy is readily available, cures quickly, is quite inexpensive and advantageously exhibits increased adhesion whenever heat is applied to the board which always occurs during soldering. This, in turn, advantageously minimizes another deficiency inherent in prior art techniques of printed circuit board fabrication. Specifically, during the course of troubleshooting a board, components are often unsoldered and replaced with others. Unfortunately, heat applied through a soldering iron, for example, tends to significantly weaken the adhesion occurring in prior art boards between the copper conductor and the substrate. As a result, pads and/or traces begin to "lift off" the board. This, in turn, causes the board to be rejected or, at the very least, undergo time-consuming manual repair. By contrast, whenever heat is applied to any portion of the conductive layer, e.g. a pad, of a board fabricated using the inventive process, this heat merely increases the "set" (cure) of the underlying epoxy layer which, in turn, increases the adhesion of the epoxy to the substrate. Advantageously, this thus minimizes the likelihood that any pad, trace or other portion of the conductive layer will lift off the board during or after repeated soldering or the like.

Inasmuch as the inventive process does not require photo-chemicals or resists, does not waste any copper, and can be practiced with readily available inexpensive materials, this process is capable of yielding significant cost savings over prior art subtractive processes. Moreover, since this process does not use any etchants, this process is not susceptible to undercutting—as are prior art subtractive processes. Thus, extremely narrow traces can be fabricated and the spacing between adjacent traces is only limited by the resolution at which the seed layer can be applied to the board and by the anticipated electrical signals carried by these traces. Thus, the inventive process permits printed circuit boards to be manufactured with a significantly higher circuit density than that currently obtainable through prior art subtractive processes. In addition, since the seed layer cures in a relatively short period of time and electrolytic deposition is far faster than electroless deposition, the inventive process requires far less manufacturing time than prior art additive process. Moreover, and more significantly, the adhesive bonds between the seed layer and the substrate and the ionic bonds between the electrolytically plated copper layer and the seed layer provide significantly improved adhesion over that obtainable with prior art additive processes.

Clearly, it is readily apparent to those skilled in the art that the inventive process, along with its advantageous results, is not only applicable to double-sided boards—as described above, but also it can be effectively used to fabricate single-sided boards. Since single-sided boards have traces on only one surface, the seed layer need only be applied to one or more holes on the other surface in order to form a pad around and coat the wall of each hole thereby establishing a number of plated-through holes which, in turn, function to route electro-plating current from the electrode through the substrate to the seed layer forming part of these traces.

Furthermore, other materials in lieu of carbon can be used for the conductive particles. These materials include any conductive substance than can be made into relatively fine particles and which either does not oxidize whenever it is exposed to the elevated temperatures needed to cure the binder or, if it does, forms a conductive oxide. Example of these materials, other than carbon, include: iron, gold, silver and platinum among others.

In addition, increased adhesion between the seed layer and the electrolytically plated conductive layer can be produced by slightly roughening (abrading) the otherwise smooth surface of the seed layer after it has been cured and before plating begins. One technique which provides this is sandblasting using a very fine grit. Alternatively, wiping the board with very fine steel wool, a wire brush, or sandpaper or similar mechanically abrasive materials can be used instead, as can most other techniques that will mechanically produce irregularities on a surface.

Although a specific illustrative process has been described herein, this merely illustrates the principles of the present invention. Many varied processes embodying these principles may be devised by those skilled in the art without departing from the spirit and scope of the invention.

I claim:

1. A method for producing a conductive pattern on predefined regions of at least first and second surfaces of a substrate, said method comprising the steps of:
    forming at least one hole in said substrate, wherein the hole extends from the predefined region on the first surface to the corresponding pre-defined region on the second surface;
    coating each of said pre-defined regions on said first and second surfaces with a seed layer in the shape of a desired conductive pattern to appear thereon, wherein the seed layer is comprised of conductive particles dispersed throughout a binder capable of adhering to said substrate;
    coating substantially all the surface area of the wall of said hole with said seed layer;
    attaching the substrate to a suitable electrode such that electrical contact is established between the electrode and the seed layer appearing on the first surface of the substrate, so that electric plating current is able to flow from said electrode through the first surface, via the seed layer appearing thereon and via the seed layer appearing on the wall of the hole, to the seed layer appearing on the second surface;
    immersing the electrode and the substrate attached thereto into a suitable electro-plating solution; and
    causing the electric plating current to flow for a pre-defined interval of time, from one surface of the substrate to the other while said substrate is immersed in said solution, whereby a conductive layer of appropriate thickness is electrolytically deposited both over the seed layer situated on the wall of the hole so as to form a plated through hole and over said second surface so as to produce the conductive pattern that is to appear thereon.

2. The method in claim 1 wherein the surface coating step includes the step of applying the seed layer on said first surface in the shape of pad adjacent to and surrounding said hole.

3. The method in claim 2 wherein the surface coating step further includes the step of applying the seed layer on said second surface in the shape of at least one trace and at least one pad.

4. The method in claim 3 wherein the surface coating step further includes the step of applying the seed layer on each of said first and second surfaces in the corresponding shape of desired patterns of traces and pads to appear thereon.

5. The method in claim 4 wherein the attaching step includes the step of establishing electrical contact between the electrode and the seed layer comprising substantially all the pads situated on the first surface.

6. The method in claim 5 wherein the surface coating step includes the step of exposing the substrate to an elevated temperature for a pre-determined amount of time in order to cure the seed layer applied to said surfaces of the substrate.

7. The method in claim 6 wherein the wall coating step includes the step of exposing the substrate to an elevated temperature for a pre-determined amount of time in order to cure the seed layer applied to the wall of the hole.

8. The method in claim 4 wherein the surface coating step further includes the step of roughening the surface of the seed layer appearing on at least one of the surfaces prior to electrolytically depositing the conductive layer onto that surface.

9. The method in claim 4 wherein the conductive particles are substantially comprised of a conductive material which either does not form an oxide when exposed to an elevated temperature sufficient to cure the binder or forms a substantially conductive oxide during exposure to said temperature.

10. The method in claim 9 wherein said seed layer is initially in the form of a liquid of sufficient viscosity to enable the seed layer to be coated onto the surfaces of said substrate by silkscreening.

11. The method in claim 10 wherein the binder is an epoxy-, acrylic- or polymeric-based adhesive.

12. The method in claim 4 wherein said binder is an epoxy-, acrylic- or polymeric-based adhesive and is initially in the form of a liquid of sufficient viscosity to enable the seed layer to be applied by silkscreening and said conductive particles are substantially comprised of one or more substances from the group comprising carbon, iron, platinum, gold or silver.

13. The method in claim 12 wherein the conductive particles are chosen to be less than a pre-selected size such that substantially all of said particles can pass through a 400 gauge mesh.

14. A method for producing a conductive pattern on predefined regions of at least first and second surfaces of a substrate, said method comprising the steps of:

forming at least one hole in said substrate, wherein the hole extends from the predefined region on the first surface to the corresponding pre-defined region on the second surface;

coating each of said pre-defined regions on said first and second surfaces with a seed layer in the shape of a desired conductive pattern of at least one trace and a pad to appear thereon, wherein the seed layer is comprised of conductive particles dispersed throughout a binder capable of adhering to said substrate;

coating substantially all the surface area of the wall of said hole with said seed layer;

attaching the substrate to a suitable electrode such that electrical contact is established between the electrode and the seed layer appearing on the first surface of the substrate, so that electric plating current is able to flow from said electrode, via the seed layer appearing thereon and comprising the pad appearing on the first surface and via the seed layer appearing on the wall of the hole, to the seed layer appearing on the second surface;

immersing the electrode and the substrate attached thereto into a suitable electro-plating solution; and causing the electric plating current to flow for a pre-defined interval of time, from one surface of the substrate to the other while said substrate is immersed in said solution, whereby a conductive layer of appropriate thickness is electrolytically deposited both over the seed layer situated on the wall of the hole so as to form a plated through hole and over said second surface so as to produce the conductive pattern that is to appear thereon.

15. The method in claim 14 wherein the surface coating step includes the step of exposing the substrate to an elevated temperature for a pre-determined amount of time in order to cure the seed layer applied to said surfaces of the substrate.

16. The method in claim 15 wherein the wall coating step includes the step of exposing the substrate to an elevated temperature for a pre-determined amount of time in order to cure the seed layer applied to the wall of the hole.

17. The method in claim 15 wherein the surface coating step further includes the step of roughening the surface of the seed layer appearing on at least one of the surfaces prior to electrolytically depositing the conductive layer onto that surface.

18. The method in claim 16 wherein said binder is an epoxy-, acrylic- or polymeric-based adhesive and is initially in the form of a liquid of sufficient viscosity to enable the seed layer to be applied by silkscreening and said conductive particles are substantially comprised of one or more substances from the group comprising carbon, iron, platinum, gold or silver.

19. A method for producing a conductive pattern on predefined regions of at least first and second surfaces of a substrate, said method comprising the steps of:

forming at least one hole in said substrate, wherein the hole extends from the predefined region on the first surface to the corresponding pre-defined region on the second surface;

coating each of said pre-defined regions on said first and second surfaces with a seed layer in the shape of a desired conductive pattern of at least one trace and a pad to appear thereon, wherein the seed layer is comprised of conductive particles dispersed throughout a binder capable of adhering to said substrate;

coating substantially all the surface area of the wall of said hole with said seed layer;

exposing the substrate to an elevated temperature for a predetermined amount of time in order to cure the seed layer applied to said surfaces of the substrate and to the wall of the hole;

attaching the substrate to a suitable electrode such that electrical contact is established between the electrode and the seed layer appearing on the first surface of the substrate, so that electric plating current is able to flow from said electrode, via the seed layer appearing thereon and comprising the pad appearing on the first surface and via the seed layer appearing on the wall of the hole, to the seed layer appearing on the second surface;

immersing the electrode and the substrate attached thereto into a suitable electro-plating solution; and causing the electric plating current to flow for a predefined interval of time, from one surface of the substrate to the other while said substrate is immersed in said solution, whereby a conductive layer of appropriate thickness is electrolytically deposited both over the seed layer situated on the wall of the hole so as to form a plated through hole and over said second surface so as to produce the conductive pattern that is to appear thereon.

20. The method in claim 19 wherein said binder is an epoxy-, acrylic- or polymeric-based adhesive and is initially in the form of a liquid of sufficient viscosity to enable the seed layer to be applied by silkscreening, and said conductive particles are substantially comprised of one or more substances from the group comprising carbon, iron, platinum, gold or silver and are chosen to be less than a pre-selected size such that substantially all of said particles can pass through a 400 gauge mesh.

* * * * *